(12) United States Patent
Kuehn

(10) Patent No.: US 7,924,103 B2
(45) Date of Patent: Apr. 12, 2011

(54) INDUCTIVE PROXIMITY SWITCH AND METHOD FOR ITS OPERATION

(75) Inventor: Thomas Kuehn, Mannheim (DE)

(73) Assignee: Pepperl + Fuchs GmbH, Mannheim (DE)

(*) Notice: Subject to any disclaimer, the term of this patent is extended or adjusted under 35 U.S.C. 154(b) by 0 days.

(21) Appl. No.: 11/782,846

(22) Filed: Jul. 25, 2007

(65) Prior Publication Data
US 2008/0024234 A1  Jan. 31, 2008

(30) Foreign Application Priority Data
Jul. 27, 2006 (EP) .................................. 06015722

(51) Int. Cl.
H03K 17/95 (2006.01)
H03B 5/04 (2006.01)
G01B 7/14 (2006.01)

(52) U.S. Cl. .. 331/65; 331/66; 324/207.15; 324/207.16; 324/207.26

(58) Field of Classification Search .................... 331/65, 331/66; 324/207.12, 207.15, 207.16, 207.26
See application file for complete search history.

(56) References Cited

U.S. PATENT DOCUMENTS

| | | | | |
|---|---|---|---|---|
| 4,543,527 A | * | 9/1985 | Schuchmann et al. | 324/207.26 |
| 4,644,298 A | * | 2/1987 | Kamiya et al. | 331/65 |
| 4,719,362 A | * | 1/1988 | Nest et al. | 307/116 |
| 4,731,591 A | * | 3/1988 | Weigand | 331/65 |
| 5,428,253 A | * | 6/1995 | Ogata et al. | 307/116 |
| 5,519,317 A | * | 5/1996 | Guichard et al. | 324/236 |
| 5,818,129 A | * | 10/1998 | Fericean et al. | 307/116 |
| 6,545,464 B1 | * | 4/2003 | Tigges et al. | 324/207.26 |
| 6,650,111 B2 | * | 11/2003 | Christensen | 324/207.26 |
| 6,995,573 B2 | * | 2/2006 | Becker et al. | 324/655 |

FOREIGN PATENT DOCUMENTS

| | | |
|---|---|---|
| DE | 4120806 A1 | 1/1993 |
| DE | 4427990 A1 | 2/1996 |
| DE | 19834071 A1 | 2/2000 |
| DE | 10004718 A1 | 8/2001 |
| EP | 0169582 A1 | 1/1986 |
| EP | 0228019 A2 | 7/1987 |

OTHER PUBLICATIONS

Peter Moll, "European Search Report", International Application No. EP 06015722, pp. 1-3, Completion Date Dec. 21, 2006.
Yunqiang Wang et al, vol. 62, No. 12, Dec. 1995, XP000550485, ISSN: 0171-8096.

* cited by examiner

Primary Examiner — Robert Pascal
Assistant Examiner — Levi Gannon
(74) Attorney, Agent, or Firm — John A. Merecki; Hoffman Warnick LLC

(57) ABSTRACT

The present invention relates to an inductive proximity switch with an oscillator having a resonant circuit and an amplifier and with an evaluating and control device for evaluating an impedance of the resonant circuit and for outputting a switching signal. According to the invention, the proximity switch is characterized in that a frequency measuring device is provided for measuring the oscillation frequency of the oscillator and for eliminating ambiguities of the evaluation result of the evaluating and control device. The invention also relates to a method for operating an inductive proximity switch.

16 Claims, 3 Drawing Sheets

INDUCTIVE PROXIMITY SWITCH AND METHOD FOR ITS OPERATION

FIELD OF THE INVENTION

The present invention relates to an inductive proximity switch according to the preamble of claim 1 and to a method for operating an inductive proximity switch according to the preamble of claim 8.

RELATED ART

Such a proximity switch is e.g. known from DE 198 34 071 and DE 41 20 806 and has an oscillator with a resonant circuit and an oscillator amplifier, as well as an evaluating and control device for evaluating an impedance of the resonant circuit and for outputting a switching signal.

In such a method for the operation of an inductive proximity switch an impedance of a resonant circuit of an oscillator is evaluated as a measure for the range of a target and by comparing the impedance with at least one threshold to be fixed a switching signal is obtained and outputted.

It is known that a coil system predamped by a dissipative medium, e.g. a metallic housing, can undergo damping reduction, at least within a given target spacing range, on approaching a nonferrous target. The reason for this is the eddy currents induced in the nonferrous target, which lead to an attenuation of the causative fields. This damping reduction effect, which is due to an overproportional decrease of the predamping losses compared with an increase in the target losses, is therefore particularly marked in the case of high conductivity metals, e.g. aluminium or copper.

As opposed to this, a damping with highly permeable ferrous metals or alloys, e.g. iron, nickel or steel, generally leads to an increase in losses over the entire target spacing range. This oppositely directed behaviour can be used for implementing nonferrous/ferrous switches with the same switching interval on both materials.

A difficulty in this connection arises in that on approaching a nonferrous target with a very small distance the damping effects by losses in the target preponderate over the described damping reduction effect. Thus, the damping reduction continuously changes into a damping, because the increase in the target losses exceeds the decrease in the predamping losses. This leads to undesired ambiguities with respect to the switching signal. In an existing solution with known nonferrous/ferrous switches, the coil system is consequently lowered to such an extent into a switch housing that the target can only approach the coil system in the range of unambiguously associated switching situations. However, this leads to an undesired decrease in the usable switching interval. In addition, this measure is limited to switches which cannot be installed in flush manner.

SUMMARY OF THE INVENTION

The object of the invention is to provide an inductive proximity switch, in which the entire sensitivity range can be utilized. In addition, a method for operating an inductive proximity switch is given, which allows longer switching intervals.

This object is achieved through the inductive proximity switch having the features of claim 1 and through the method having the features of claim 8.

Preferred embodiments of the inventive proximity switch and advantageous variants of the inventive method form the subject matter of the dependent claims.

The inductive proximity switch of the aforementioned type is inventively further developed in that a frequency measuring device is provided for measuring the resonant frequency of the oscillator and for eliminating ambiguities in the evaluation result of the evaluating and control device.

The method of the aforementioned type is inventively further developed in that additionally the oscillator frequency is measured for eliminating ambiguities in the evaluation of the oscillation amplitude of the oscillator.

The fundamental idea of the invention is, in addition to evaluating the resonant circuit impedance or oscillator amplitude, to measure the oscillator frequency so as in this way to obtain additional information. Use is made of the fact that a damping of the oscillator with a nonferrous target in the case of very short spacings leads to a lower inductance and therefore to a higher oscillation frequency compared with greater spacings.

An important advantage of the proximity switch and method according to the invention is that using simple means use can be made of the entire sensor sensitivity range and therefore longer switching intervals can be achieved.

As the indicated frequency differences are in the percentage range, the actual frequency measurement can be made simple. The inventive advantages can consequently be inexpensively implemented in the case of simply constructed proximity switches.

Fundamentally, the proximity switch according to the invention can be implemented with a continuously operating oscillator having two separate switching thresholds for the oscillator amplitude and the passing above or below the same being interpreted as a nonferrous or ferrous switching signal. In this context, the term continuously operating oscillator is understood to mean an oscillator in which the oscillation amplitude varies comparatively slowly with the target spacing.

With the aid of a logic OR-operation of the two switching signals the desired function of a material-independently operating sensor can be obtained, provided that the oscillation frequency is used as an additional quantity.

In particularly preferred manner the inventive proximity switch is implemented with the aid of a very steep or discontinuously operating oscillator, whose oscillation state varies within a very small impedance range. Extremely small resonant circuit impedance changes can also be evaluated with such an oscillator.

In an advantageous variant of the inductive proximity switch the oscillator amplifier is an adjustable, particularly voltage-controlled amplifier. Particular preference is given to highly linear amplifiers, in which even a small resonant impedance change is imaged on a large amplitude swing. With such voltage-controlled amplifiers it is possible to set very clearly defined switching thresholds for the proximity switch. Through a specific gain set for the oscillator amplifier a threshold for the resonant impedance is fixed. Thus, at the resonant impedance corresponding to the threshold the amplitude change with an impedance change is particularly high. In a simple evaluation case a check is then merely made as to whether or not the oscillator oscillates.

With regards to the ferrous and nonferrous metals to be identified it is appropriate if the voltage-controlled oscillator amplifier is adjustable to at least two different gains. Appropriately the oscillator amplifier is switched between two precisely defined gains and after switching the respective oscillation state of the oscillator is evaluated. The gains are selected in such a way that there is a particularly large amplitude change if a nonferrous target or a ferrous target moves through the switching point. Preferably the thresholds are also chosen in such a way that the same switching interval is obtained for the nonferrous targets as for the ferrous targets.

The evaluation of an oscillation amplitude of the oscillator can in the case of a simple implementation variant be implemented with the aid of a comparator downstream of the oscillator amplifier and appropriately a rectifier can be provided between amplifier and comparator. If the oscillation amplitude is above a set comparator threshold, the comparator output signal also oscillators as a square-wave signal with the given oscillation frequency. Therefore said square-wave signal can be very simply used for frequency determination.

The control and evaluating device can e.g. be a microcontroller in which is also integrated the frequency measuring device.

The frequency measurement can be performed in fundamentally known manner. In particularly simple manner a frequency determination or measurement can take place by counting the oscillation periods, e.g. using the microcontroller.

The voltage-controlled oscillator amplifier gain which is to be variably adjusted can also be used for compensating temperature variations of the switching interval. For determining a temperature of the electronic components and for compensating temperature variations of the switching interval, from the equipment standpoint a temperature sensor cooperating with the voltage-controlled oscillator amplifier is provided. The temperature sensor can e.g. be a NTC network. The functionality and reliability of the proximity switch in such variants can also be considerably improved for uses with widely fluctuating ambient temperatures.

It is an important advantage of the invention that the entire sensitivity range of the sensor can be used and therefore the switching interval increased. In a particularly preferred variant of the inventive proximity switch, a sensor housing is constructed in such a way that an inductance coil can be installed flush therein with respect to the sensor surface.

To obtain a proximity switch which has essentially the same switching interval for nonferrous and ferrous targets, appropriately a switching signal is outputted if the resonant circuit impedance drops below a lower threshold or exceeds an upper threshold. The lower and upper thresholds can appropriately be established in learning sweeps or passes.

An unambiguous switching signal and an information as to whether a ferrous or nonferrous target is involved, is obtained on successively performing the following method steps:
a) measuring the oscillation amplitude with a first gain,
b) setting the switching signal if the oscillator does not oscillate during the first gain and return to step a),
c) measuring the oscillator frequency if the oscillator oscillates during the first gain,
d) setting the switching signal, if the measured frequency is in a frequency range to be established and return to step a),
e) measuring the oscillation amplitude for a second gain, if the measured frequency is not in the frequency range to be fixed,
f) setting the switching signal, if the oscillator oscillates during the second gain and return to step c), and
g) return to step a), if the oscillator does not oscillate during the second gain.

As a result of the first gain a lower threshold for the resonant impedance of the resonant circuit is defined. Correspondingly, through the second gain an upper threshold for the resonant impedance is fixed.

In the case of the proximity switch according to the invention, apart from a pure switching signal as a result of the additional information through the frequency measurement a further signal can be outputted indicating whether the identified target is a ferrous or nonferrous target.

BRIEF DESCRIPTION OF THE DRAWINGS

Further advantages and features of the invention are described in greater detail hereinafter relative to the attached drawings, wherein show.

DETAILED DESCRIPTION OF THE INVENTION

Figure 1:
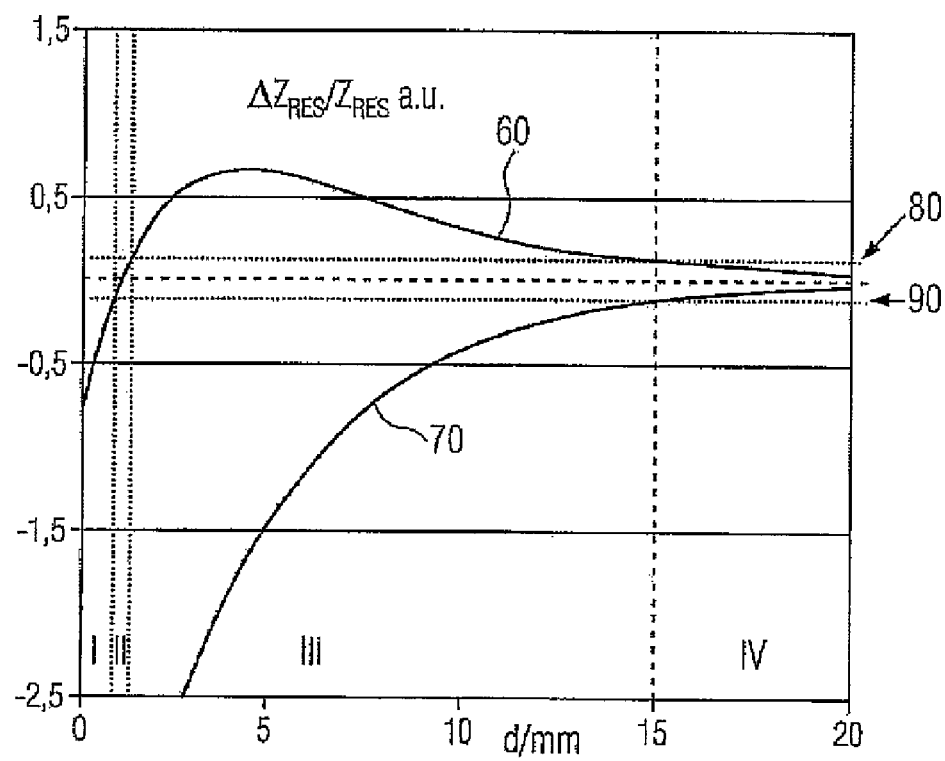
FIG. 1 A graph in which the change of the resonant impedance in the relevant spacing or distance range for the nonferrous and ferrous targets is plotted.

FIG. 1 shows the relative change of the resonant impedance $\Delta Z/Z$ of a resonant circuit on approaching a target for a proximity switch with a nominal switching interval d of 15 mm. The curve belonging to a nonferrous target carries reference numeral 60. The curve carrying the reference numeral 70 shows the path of the resonant impedance $\Delta Z/Z$ for a ferrous target. In the embodiment shown the resonant circuit is a parallel resonant circuit, so that an increase in the resonant impedance Z corresponds to a loss decrease or damping reduction and vice versa.

The situation is only unambiguous for a nonferrous target in area III, where the resonant impedance exceeds an upper threshold 80. As this is only implemented for a nonferrous target in this spacing range, it is possible to unambiguously decide that a nonferrous target is closer than switching interval d to the sensor.

Areas I, II and IV, as well as area III if a ferrous target is to be identified, cannot, however, be differentiated solely on the basis of the impedance measurement. Thus, a resonant impedance lower than the lower threshold 90 is implemented both in area I by a nonferrous target and in area III by a ferrous target. Moreover, resonant impedances between the upper threshold 80 and lower threshold 90 are implemented by a nonferrous target in areas II and IV and also by a ferrous target in area IV.

Area II in which the switch should switch, because the target is clearly closer than switching interval d to the sensor, can consequently not be differentiated from area IV in which the switch is not intended to switch and this is extremely undesirable.

The solution according to the invention involves extending the pure impedance evaluation by an oscillator frequency measurement. A damping by a nonferrous target in area II, as a result of the eddy currents induced in the target, leads to a lower inductance and therefore to a higher oscillating frequency than a corresponding damping in area IV. By distinguishing the two oscillation frequencies, it is therefore possible in spite of identical resonant impedances to derive an unambiguous statement as to whether there is damping in area II or IV. Thus, there is no longer a need to lower the inductance coil and it is possible to implement switches which can be installed flush or at least substantially flush.

As the oscillation frequencies of the oscillator in the areas to be differentiated clearly differ and the frequency difference is in the percentage range, there is no need for a high precision or high resolution determination of the oscillation frequency. There can instead be a comparatively approximate separation of the two frequencies and the frequency measurement costs can be kept low. It can e.g. be adequate to count the oscillation periods over a sufficiently long time interval.

Figure 2:
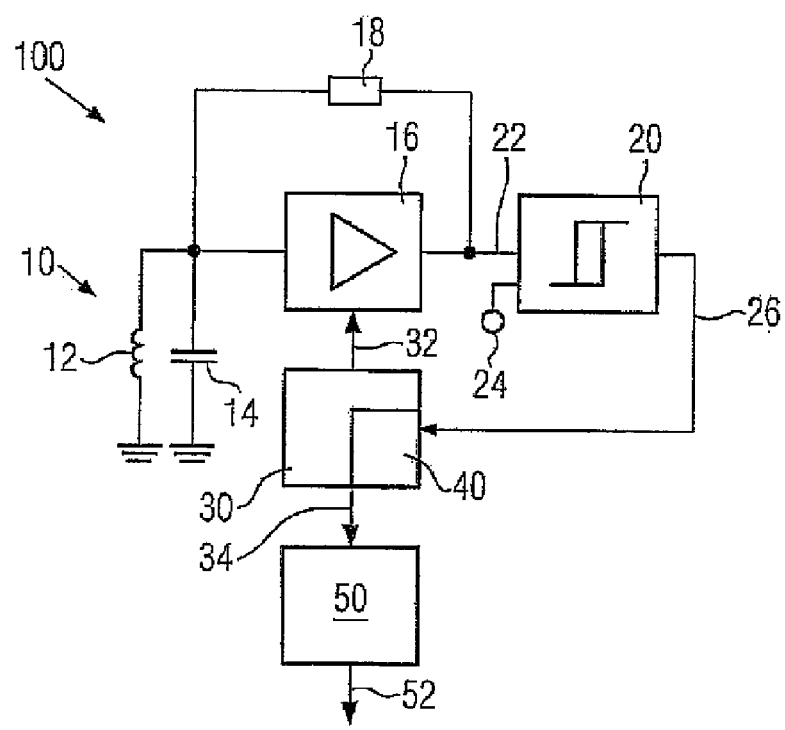
FIG. 2 A block circuit diagram of an inventive, inductive proximity switch.

FIG. 2 shows a possible embodiment of an inventive, inductive proximity switch 100. The proximity switch 100 has as its essential components a resonant circuit 10, an oscillator amplifier 16, a comparator 20, a microcontroller 30 as the evaluating and control device with frequency measuring device 40, as well as an output amplifier 50.

The resonant circuit 10 is a parallel resonant circuit and is formed by an inductance coil 12 and a capacitor 14. Resonant circuit 10 forms an oscillator together with the oscillator amplifier 16 fed-back across a resistor 18. Oscillator amplifier 16 is a voltage controlled amplifier, positive fed-back across the inductance coil 12 or resonant circuit 10.

The oscillator switching threshold is determined by the gain of oscillator amplifier 16. This is in turn defined by a control voltage generated by the microcontroller 30 as the evaluating and control device and supplied to amplifier 16 via an input 32. For this purpose a digital-analog converter or a pulse width modulation source with low-pass filter can e.g. be provided in microcontroller 30. Switching between the two thresholds for determining the damping state and then for determining the resonant impedance of the resonant circuit 10 takes place through corresponding switching of the control voltage of amplifier 16. Said control voltage can additionally be used for tracking the switching interval d in the case of temperature variations.

An output signal of amplifier 16 is supplied to a first input 22 of a comparator 20, which in the embodiment shown can be a Schmitt trigger. To a second input 24 of comparator 20 is applied a reference voltage, which can also be generated in microcontroller 30. If the oscillator now oscillates with an amplitude determined by the reference voltage applied to input 24 of comparator 20, square-wave pulses occur at output 26 of comparator 20 and on the one hand permit a monitoring of the switching state and on the other allow a frequency determination. For this purpose output 26 of comparator 20 is connected to microcontroller 30.

The inventively provided frequency measuring device 40 is integrated into microcontroller 30 and in a simple embodiment counts the square-wave pulses emitted by comparator 20 over a sufficiently long time interval.

In microcontroller 30 both the measurement information with respect to the resonant impedance, i.e. the oscillator amplitude, and the frequency information is processed and as a function thereof a signal is provided at output 34 of microcontroller 30. This signal is supplied to a final or power amplifier 50, which generates therefrom the switching signal 52 emitted by sensor 100. It is also possible for microcontroller 30 to emit a further signal indicating whether a ferrous or nonferrous target is involved. This is possible in areas II and III.

Figure 3:
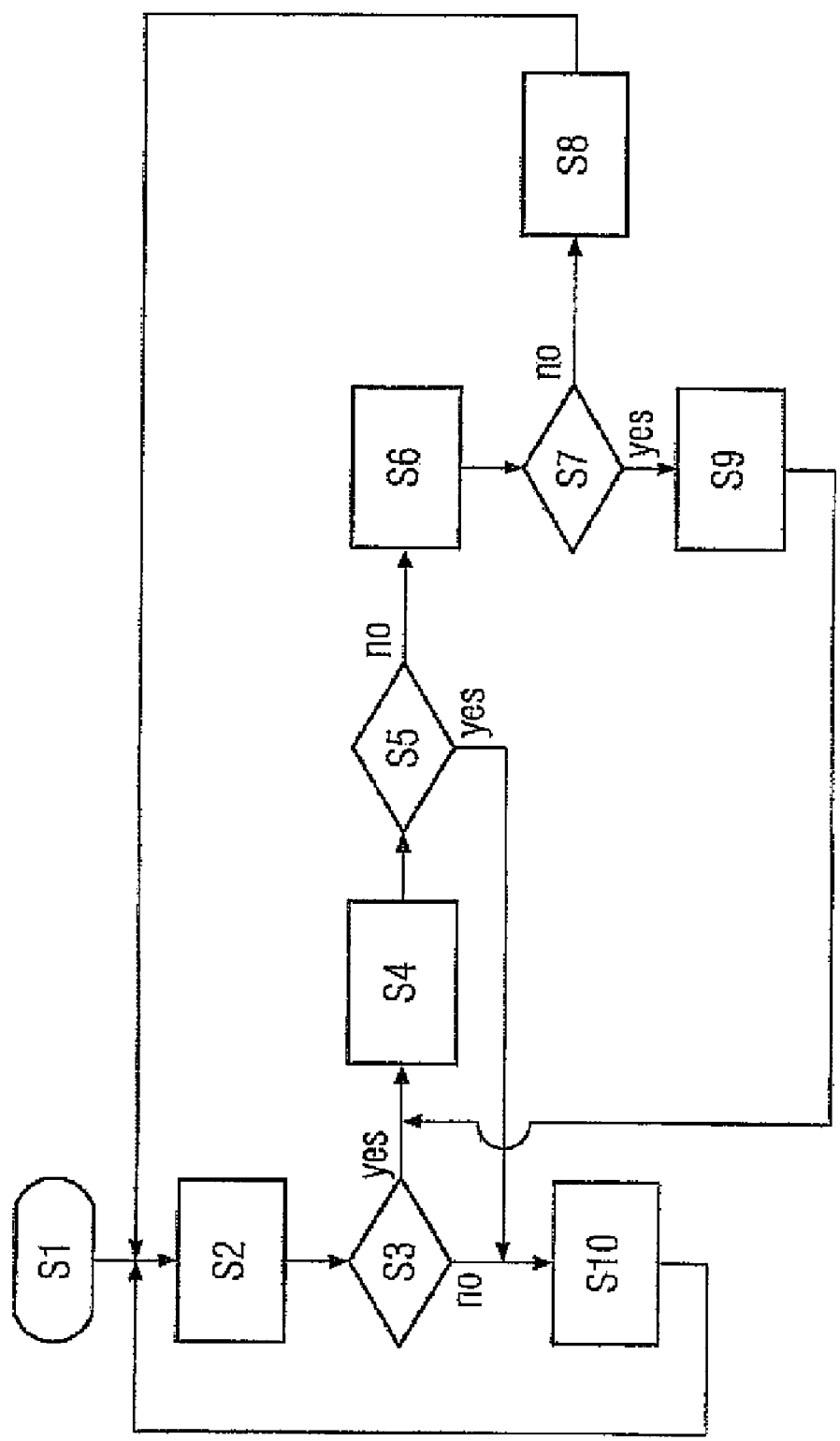
FIG. 3 A flow chart on the basis of which a variant of the inventive method is illustrated.

A method example as to how the described measurement information can be evaluated in microcontroller 30 and how the measurement sequence can be controlled, is illustrated by FIG. 3.

Commencing at start S1 of the flow chart, firstly in step S2 there is a measurement at a first gain of oscillator amplifier 16 corresponding to the lower threshold 90 in the graph of FIG. 1. A check is then made in step S3 to establish whether the oscillator is oscillating, i.e. whether the resonant impedance of the resonant circuit is higher than the lower threshold. If this is the case, a frequency measurement is performed in step S4 and then in step S5 a check is made as to whether the frequency is in the frequency range belonging to area II in FIG. 1. If this is the case, i.e. the target is in area II, i.e. much nearer than the switching interval at the sensor, in step S10 the switch is operated and the sequence returns to step S2. If the check in step S3 reveals that the oscillator is not oscillating, in step S10 the switch is operated, because then in area III the location is on a curve 70 belonging to a ferrous target.

If the frequency determined in step S5 does not correspond to the frequency belonging to area II and a nonferrous target, there is a transfer to step S6, where a measurement of the oscillator amplitude takes place at a second threshold corresponding to the upper threshold 80 shown in the graph of FIG. 1. Finally in step S7, there is once again a check to establish whether the oscillator is oscillating. If this is the case, the location is in area III and a nonferrous target is involved and consequently in step S9 the switch is operated. This is followed by a transfer to step S4 and the oscillation frequency is measured again.

If the check in step S7 reveals that the oscillator is not oscillating, then in step S8 the switch remains unoperated and there is a transfer to the start of the sequence in step S2.

The sequence described here can be extended in such a way that a clear distinction can also be made between area I for a nonferrous target and area III for a ferrous target.

Figure 4:
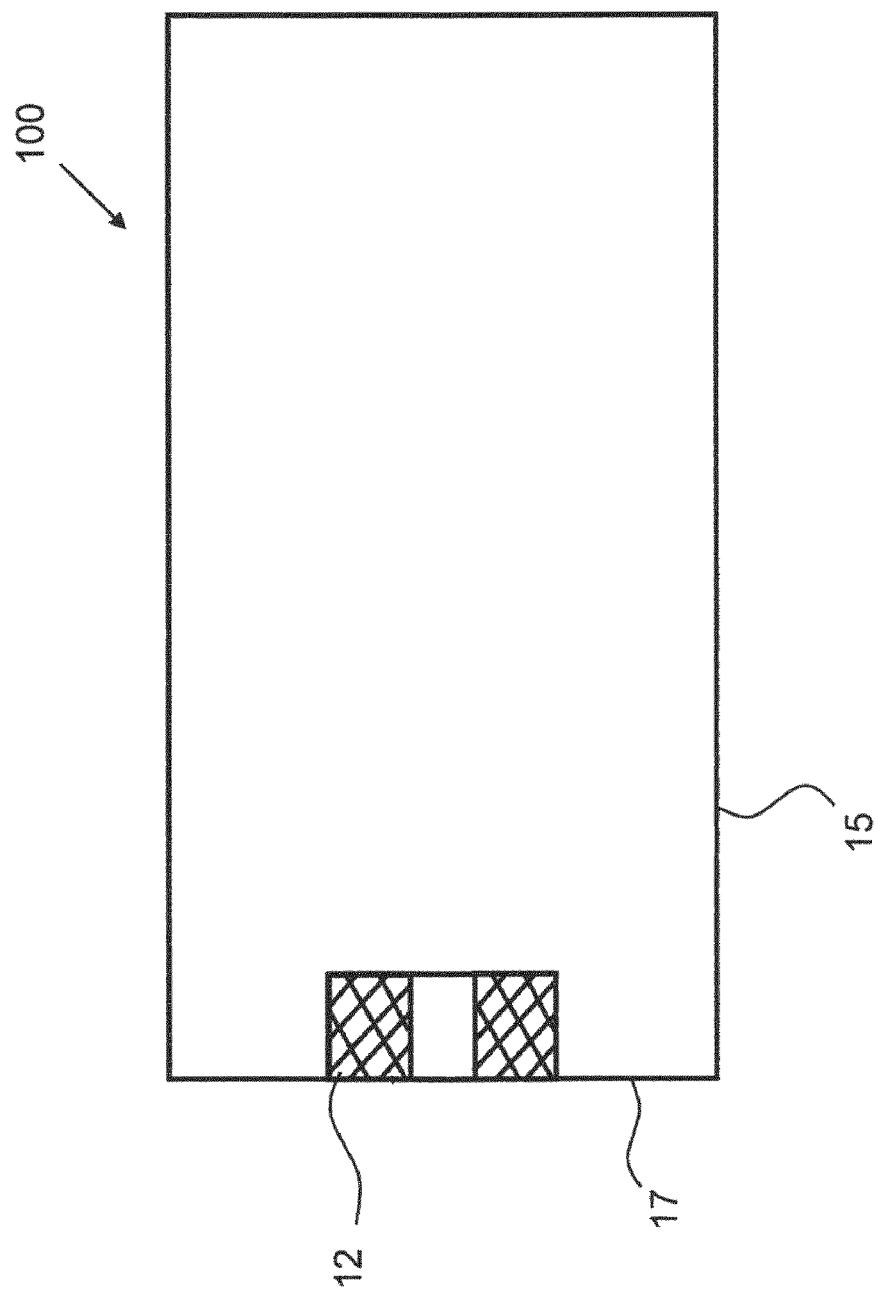
FIG. 4 shows a schematic view of a sensor housing.

FIG. 4 shows schematically a sensor housing 15 of a sensor 100 according to the invention. The sensor housing 15 is constructed in such a way that, relative to a sensor surface 17, the inductance coil 12 can be installed in a flush manner.

The present invention provides a novel inductive proximity switch, where a much higher functionality is achieved using simple means. Through a combined evaluation of both the impedance and the frequency changes, in the case of the inventive proximity switch it is possible to identify an approach or presence, as well as additionally differentiate nonferrous and ferrous targets. Ferrous metals are here understood to mean in particular iron, nickel and steel. It is in particular possible to construct inductive proximity switches having the same switching interval d for nonferrous and ferrous targets.

As a result of the inventive, combined evaluation of impedance and frequency changes, in principle the entire sensitivity range of the inductive proximity switch can be used and in particular sensors can be created in which, relative to an external sensor surface, the inductance coil can be installed flush.

An important advantage of such a structure is that longer switching intervals can be obtained.

The invention claimed is:

1. Inductive proximity switch, comprising:
    an oscillator with a resonant circuit and an oscillator amplifier,
    an evaluating and control device for evaluating an impedance (Z) of the resonant circuit and for outputting a switching signal, and
    a frequency measuring device for measuring an oscillation frequency of the oscillator and for eliminating ambiguities of an evaluation result of the evaluating and control device with respect to whether a target is a ferrous or a non-ferrous target
    wherein the oscillator amplifier can be set to at least two different gains.

2. Proximity switch according to claim 1, wherein the oscillator amplifier is a voltage-controlled amplifier.

3. Proximity switch according to claim 1, further comprising a comparator downstream of the oscillator amplifier for evaluating an oscillation amplitude of the oscillator based upon an output signal of the oscillator amplifier and a reference voltage supplied by the evaluating and control device.

4. Proximity switch according to claim 1, wherein the oscillation frequency measurement takes place by counting oscillation periods in a microcontroller.

5. Proximity switch according to claim 1, further comprising a sensor housing in which an inductance coil of the resonant circuit is installed in a flush manner.

6. Proximity switch according to claim 1, further comprising a temperature sensor, cooperating with the oscillator amplifier, the temperature sensor determining a temperature of the electronic components and for compensating temperature variations.

7. Proximity switch according to claim 1, wherein the frequency measuring device further eliminates the ambiguities by determining whether the oscillator is oscillating before the measuring of the oscillation frequency of the oscillator.

8. Method for operating an inductive proximity switch comprising:
  evaluating an impedance (Z) of a resonant circuit of an oscillator as a measure for a range of a target, the oscillator including a resonant circuit and an oscillator amplifier,
  comparing the impedance (Z) of the resonant circuit with at least one threshold to obtain and output a switching signal, and
  measuring the frequency of the oscillator in order to eliminate ambiguities of an evaluation result of the impedance (Z) of the resonant circuit with respect to whether a target is a ferrous or a non-ferrous target;
  wherein the oscillator amplifier can be set to at least two different gains.

9. Method according to claim 8, further comprising outputting a switching signal if the impedance (Z) drops below a lower threshold or exceeds an upper threshold.

10. Method according to claim 9, further comprising establishing the lower threshold and/or the upper threshold in learning sweeps.

11. Method according to claim 8, wherein a voltage-controlled amplifier is used as the oscillator amplifier.

12. Method according to claim 8, further comprising using a gain of the oscillator amplifier, for compensating temperature variations of a switching interval (d).

13. Method according to claim 8, wherein the at least two different gains of the oscillator amplifier comprise a first gain and a second gain, the method further comprising:
  a) measuring an oscillation amplitude at the first gain,
  b) setting the switching signal if during the first gain the oscillator does not oscillate and return to step a),
  c) measuring an oscillator frequency if the oscillator oscillates during the first gain,
  d) setting the switching signal if the measured frequency is in a frequency range to be fixed and return to step a),
  e) measuring the oscillation amplitude at the second gain, if the measured frequency is not in the frequency range to be fixed,
  f) setting the switching signal if the oscillator oscillates during the second gain and return to step c), and
  g) return to step a), if the oscillator does not oscillate during the second gain.

14. Method of claim 8, further comprising:
  establishing whether the oscillator is oscillating by determining whether the impedance (Z) of the resonant circuit is above a lower threshold before the measuring of the frequency of the oscillator.

15. Method of claim 14, further comprising:
  measuring the frequency of the oscillator in response to the establishing that the oscillator is oscillating.

16. Method of claim 14, further comprising:
  concluding that the target is a ferrous target in the case that the oscillator is not oscillating.

* * * * *